(12) United States Patent
Kim et al.

(10) Patent No.: US 7,192,884 B2
(45) Date of Patent: Mar. 20, 2007

(54) METHOD FOR MANUFACTURING SEMICONDUCTOR LASER DEVICE

(75) Inventors: Dong Joon Kim, Seoul (KR); Byung Deuk Moon, Kyungki-do (KR); Sang Heon Han, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 275 days.

(21) Appl. No.: 10/689,629

(22) Filed: Oct. 22, 2003

(65) Prior Publication Data

US 2004/0262259 A1 Dec. 30, 2004

(30) Foreign Application Priority Data

Jun. 24, 2003 (KR) .................. 10-2003-0040961

(51) Int. Cl.
*H01L 21/302* (2006.01)
(52) U.S. Cl. ............... 438/752; 438/41; 438/60; 438/75; 438/694; 438/745
(58) Field of Classification Search ............ 438/41, 438/60, 75, 694, 745, 752
See application file for complete search history.

(56) References Cited

U.S. PATENT DOCUMENTS 5,445,993 A 8/1995 Ahn et al.
5,478,775 A * 12/1995 Fujii ...................... 438/40
6,924,162 B2 * 8/2005 Watanabe et al. ........... 438/41
6,955,994 B2 * 10/2005 Watanabe et al. .......... 438/745

FOREIGN PATENT DOCUMENTS

| JP | 01-232784 | | 9/1989 |
| JP | 02-260485 | * | 10/1990 |
| JP | 04-82291 | | 3/1992 |
| JP | 06-69599 | | 3/1994 |
| JP | 2002-198616 | | 7/2002 |
| JP | 2002-246684 | | 8/2002 |
| KR | 2003-010083 | * | 2/2003 |

OTHER PUBLICATIONS

Japanese Patent Office Office Action mailed May 23, 2006.

* cited by examiner

*Primary Examiner*—George A. Goudreau
(74) *Attorney, Agent, or Firm*—Lowe Hauptman & Berner, LLP.

(57) ABSTRACT

Disclosed is a method for manufacturing a semiconductor laser device, comprising the steps of: (a) forming a first conductive-type clad layer, an active layer, and a second conductive-type clad layer on a first conductive-type semiconductor substrate; (b) forming a ridge structure by selectively etching the second conductive-type clad layer; (c) forming a current blocking layer around the ridge structure, the current blocking layer having protrusions on the upper surface thereof adjacent to the ridge structure, and an amorphous and/or polycrystalline layer on a partial area thereof; and (d) removing at least the amorphous and/or polycrystalline layer from the current blocking layer, and wet-etching the upper surface of the current blocking layer so that the protrusions are reduced in size.

6 Claims, 5 Drawing Sheets

METHOD FOR MANUFACTURING SEMICONDUCTOR LASER DEVICE

BACKGROUND OF THE INVENTION

1. Field of the Invention

The present invention relates to a method for manufacturing a semiconductor laser device, and more particularly to a method for manufacturing a semiconductor laser device, which prevents various failures caused by protrusions formed on the upper surface of a current blocking layer and an amorphous and/or polycrystalline layer formed at a partial area of the protrusions.

2. Description of the Related Art

Recently, semiconductor laser diodes have been adapted as light sources for light pick-up devices of optical disk systems such as CDs or DVDs in the optical communication field, and have been further applied in various fields such as multiplex and space communications. The reason is that a laser beam generated from a semiconductor laser diode has a narrow frequency bandwidth (short wavelength property) and high directivity, and assures high output power.

Generally, in order to allow current injection efficiency of a semiconductor laser device to be improved, the semiconductor laser device employs a p-type clad layer with a selectively buried ridge (SBR) structure. FIGS. 1a and 1b show a conventional semiconductor laser device 20.

As shown in FIG. 1a, the semiconductor laser device 20 comprises a substrate 11 provided with a first electrode 21 formed on the lower surface thereof, a first conductive-type clad layer 12 formed on the substrate 11, an active layer 13 with a multi-quantum well structure, a second conductive-type clad layer 14 provided with a ridge structure, and a cap layer 15 formed on the upper surface of the ridge structure.

The semiconductor laser device 20 further comprises a current blocking layer 18, made of a first conductive-type material, formed on the upper surface of the second conductive-type clad layer 20 around the ridge structure, and a contact layer 19 and a second electrode 22 sequentially formed on the cap layer 15 and the current blocking layer 18. A buffer layer (not shown) suitable for the lattice matching may be additionally interposed between partial layers (for example, between the substrate 11 and the first conductive-type clad layer 12) of the obtained crystalline structure.

More specifically, in a semiconductor laser device for generating a laser beam with a wavelength of 650 nm, which is adapted to reproduce a DVD, an n-type GaAs substrate is used as the substrate 11, and an n-type AlGaInP layer and a p-type AlGaInP layer are used as the first conductive-type clad layer 12 and the second conductive-type clad layer 14, respectively. Further, the active layer 13 has the multi-quantum well structure for generating light with a wavelength of 650 nm, and a p-type GaAs layer is used as the cap layer 15.

A mask (not shown) made of a material such as $SiO_2$ is located at a current injection area of the cap layer 15, and then a wet-etching process is performed on the cap layer 15 and the second conductive-type clad layer 14, thereby forming the ridge structure shown in FIG. 1a. In order to prevent the active layer 13 from being damaged during the wet-etching process, an etching-blocking layer (not shown) may be additionally provided at a designated depth of the second conductive-type clad layer 14.

After the mask is removed from the current injection area of the cap layer 15, the current blocking layer 18 is formed. An n-type GaAs layer, which is doped with an impurity having a conductive type different from the second conductive-type clad layer 14. Then, the p-type GaAs contact layer 19 and the second electrode 22 are sequentially formed thereon. Thereby, the semiconductor laser diode 20 shown in FIG. 1a is obtained.

Since the current blocking layer 18 is formed along the side wall of the ridge structure of the second conductive-type clad layer 14, the current blocking layer 18 has protrusions A inclined at a designated angle. Particularly, the protrusions A of the current blocking layer 18 have a relatively large size such that they are formed over almost the entire area of the current blocking layer 18, and an amorphous or polycrystalline layer is formed on a dielectric mask and an interface between the dielectric mask and the current blocking layer 18.

Accordingly, the protrusions A of the current blocking layer 18 and the amorphous or polycrystalline layer formed at a partial area of the current blocking layer 18 may have an undesired affect on the crystal growth of the p-type GaAs contact layer 19 formed thereon. Thereby, V-shaped grooves B are formed in the upper surface of the p-type GaAs contact layer 19.

FIG. 1b is a photograph of a cross-section of a semiconductor laser device manufactured by the conventional method. As shown in FIG. 1b, the amorphous or polycrystalline layer formed at the partial area of the current blocking layer 18 and the protrusions A cause a poor surface state of the p-type GaAs contact layer 19 formed thereon and an uneven surface of the electrode formed thereon, thus causing a failure in the connection between the electrode and the device and more particularly electrode cutting.

As described above, the surface state of the current blocking layer 18 and the V-shaped grooves B formed by the amorphous or polycrystalline layer formed thereon may cause severe failures during the following step. For example, a metal material is formed over the entire surface of the device during an electrode forming step for an Ohmic contact, thereby forming an undesired electrode, and cracks are formed in the upper surface of a chip during a chip cleaving step.

SUMMARY OF THE INVENTION

Therefore, the present invention has been made in view of the above problems, and it is an object of the present invention to provide a method for manufacturing a semiconductor laser device, which prevents failures caused by protrusions formed on the upper surface of a current blocking layer due to a ridge structure and an amorphous and/or polycrystalline layer formed at a partial area of the protrusions, thus improving crystallinity and surface state of a contact layer.

In accordance with the present invention, the above and other objects can be accomplished by the provision of a method for manufacturing a semiconductor laser device, comprising the steps of: (a) sequentially forming a first conductive-type clad layer, an active layer, and a second conductive-type clad layer, on a first conductive-type semiconductor substrate; (b) forming a ridge structure by selectively etching the second conductive-type clad layer; (c) forming a current blocking layer around the ridge structure, the current blocking layer having protrusions on the upper surface thereof adjacent to the ridge structure, and an amorphous and/or polycrystalline layer on a partial area thereof; (d) removing at least the amorphous and/or polycrystalline layer from the current blocking layer, and wet-etching the upper surface of the current blocking layer so that the protrusions are reduced in size; and (e) forming a second conductive-type contact layer on the upper surface of the current blocking layer.

In order to more reliably remove the amorphous and/or polycrystalline layer and reduce the protrusions during the wet etching step, preferably, an upper surface of the second conductive-type clad layer may be a {100} plane, and an inclined surface of the ridge structure of the second conductive-type clad layer may be near to a {111} plane.

Preferably, the step (b) may include: (b-1) forming a mask on a part of an upper surface of the second conductive-type clad layer; and (b-2) etching the second conductive-type clad layer so that the ridge structure is formed at the area of the mask. In this case, the step (d) may include the step of wet-etching the upper surface of the current blocking layer after the mask is removed.

Further, preferably, the current blocking layer may be made of a first conductive-type AlGaAs/GaAs material, and the step (d) may include the step of wet-etching the upper surface of the current blocking layer using an EG-group etchant.

A conventional method for manufacturing a semiconductor laser device comprises three growth steps. First, there is performed the first growth step, in which a first conductive-type clad layer, an active layer, and a second conductive-type clad layer are sequentially grown. After the first growth step, the second conductive-type clad layer is selectively etched using a dielectric mask so that a ridge structure is formed on the second conductive-type clad layer. Then, there is performed the second growth step, in which a current blocking layer made of a first conductive-type semiconductor material is formed. After the dielectric mask is removed, there is performed the third growth step, in which a second conductive-type contact layer is formed.

Here, protrusions are formed on the upper surface of the current blocking layer formed by the second growth step along the side wall of the ridge structure, and an amorphous and/or polycrystalline layer is formed at a partial area of the protrusions, i.e., on an interface between the protrusions and the mask. The protrusions and the amorphous and/or polycrystalline layer have a negative effect on the crystal growth of the second conductive-type contact layer formed by the third growth step, thereby causing a failure of the junction of an electrode formed by the following step and damage to the obtained chip during a chip-cleaving step.

Accordingly, in view of the above problems, the present invention provides a method for manufacturing a semiconductor laser device, comprising a wet-etching step applied to the surface of the current blocking layer between the second and third growth steps. In the wet-etching step of the method of the present invention, the amorphous and/or polycrystalline layer is removed and the protrusions are reduced in size, thus allowing the second conductive-type contact layer to have excellent crystallinity and surface state.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

FIGS. 2a to 2e are cross-sectional views illustrating a method for manufacturing a semiconductor laser device in accordance with an embodiment of the present invention.

Figure 2A:
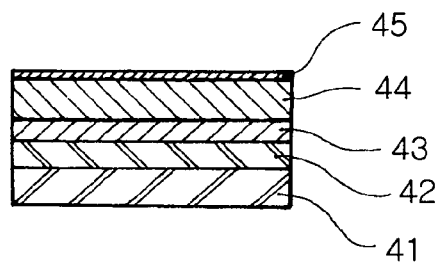
FIGS. 2a to 2e are cross-sectional views illustrating a method for manufacturing a semiconductor laser device in accordance with an embodiment of the present invention.

As shown in FIG. 2a, a first conductive-type clad layer 42, an active layer 43, and a second conductive-type clad layer 44 are sequentially formed on a first conductive-type semiconductor substrate 41. Here, in this embodiment, a second conductive-type cap layer 45 may be additionally formed on the second conductive-type clad layer 44.

For example, in order to manufacture a semiconductor laser device for generating light of a wavelength of 780 nm, an n-type GaAs substrate is used as the first conductive-type semiconductor substrate 41, and an n-type AlGaAs layer and a p-type AlGaAs layer are respectively used as the first conductive-type clad layer 42 and the second conductive-type clad layer 44. Further, an undoped AlGaAs layer with a multi-quantum well structure is used as the active layer 43, and a p-type GaAs layer is used as the cap layer 45.

Figure 2B:
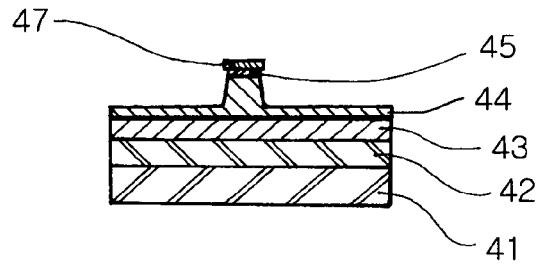

Thereafter, as shown in FIG. 2b, the second conductive-type clad layer 44 and the cap layer 45 are selectively etched so that a ridge structure is formed therein. The ridge structure shown in FIG. 2b is obtained by arranging a mask 47 made of a dielectric material such as $SiO_2$ or SiN on a ridge area of the cap layer 45 and then removing other area of the cap layer 45 except for the ridge area by etching using the mask 47. In order to protect the active layer 43 during the above etching step for forming the ridge structure, an etching-blocking layer (not shown) is formed on a designated area of the second conductive-type clad layer 44 at the step shown in FIG. 2a.

Figure 2C:
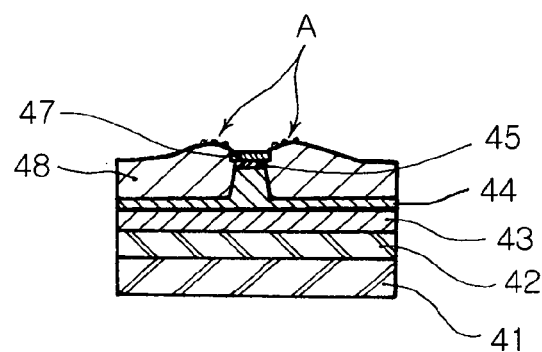

Then, as shown in FIG. 2c, a current blocking layer 48 is formed on the upper surface of the second conductive-type clad layer 44 around the ridge structure. The current blocking layer 48 is made of a first conductive-type semiconductor material, and more particularly made of n-type AlGaAs/GaAs, or one material or combined material selected from the group consisting of GaAs, AlGaAs, and AlInP. Here, the current blocking layer 48 is formed along the side wall of the ridge structure, thus having protrusions A being adjacent to the ridge structure.

However, an amorphous and/or polycrystalline layer is formed on a partial area of the protrusions A (particularly, on an interface between the protrusions A and the mask 47) under the influence of the obtained ridge structure and the employed dielectric mask 47. Such protrusions A, and particularly the area, on which the amorphous and/or polycrystalline layer is formed, may have a negative effect on the characteristics of a second conductive-type contact layer to be grown thereon. Accordingly, there is required a step of removing the protrusions A provided with the amorphous and/or polycrystalline layer after the step of forming the current blocking layer 48.

Figure 2D:
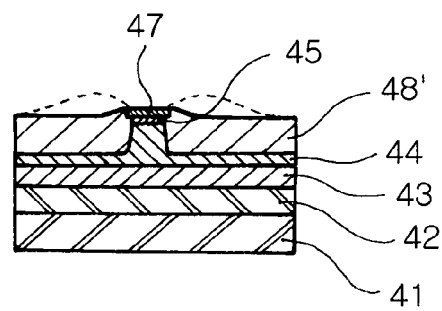

FIG. 2d illustrates a reduced current blocking layer 48' obtained by removing the amorphous and/or polycrystalline layer from the current blocking layer 48 and reducing the protrusions A by wet-etching. As described above, compared with the surface state (shown in a dotted line) of the current blocking layer 48 prior to the wet etching, the reduced current blocking layer 48' obtained by the wet etching performed thereon has an excellent surface state and crystallinity suitable to form a second conductive-type contact layer thereon. In case that the current blocking layer 48 is made of an AlGaAs/GaAs semiconductor material, an EG-group etchant such as $H_2SO_4$, $H_2O_2$, or ethylene glycol is used as an etchant at the above etching step.

However, the etchant adapted by the present invention is not limited thereto, and any etchant which has a mechanism for oxidizing and then etching the AlGaAs/GaAs semiconductor material may be applicable.

As described above, during the etching step, the amorphous and/or polycrystalline layer is removed from the current blocking layer 48, and the protrusions A are reduced, thus allowing the reduced current blocking layer 48' to have a flat upper surface. Such an etching effect influences the crystalline orientation of the current blocking layer 48'. That is, the AlGaAs/GaAs crystals of the current blocking layer 48' have an etching speed at the {111} plane higher than that at the {100} plane.

In order to maximize the etching effect, preferably, the current blocking layer 48 is grown such that the upper surface of the current blocking layer 48 is the {100} plane and the inclined plane of the current blocking layer 48 is near to the {111} plane. By the etching of the current blocking layer 48, the inclined plane, which is near to the {111} plane, is etched at a high speed, and the upper surface, which is the {100} plane, is etched at a low speed. Thus, the sizes of the protrusions A are reduced, and the upper surface of the current blocking layer 48 is flattened.

Figure 2E:
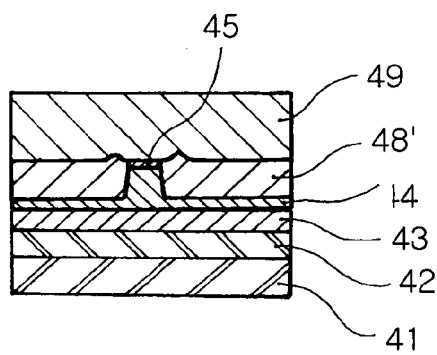

As shown in FIG. 2e, a second conductive-type contact layer 49 is formed on the upper surface of the reduced current blocking layer 48' with the improved surface state. The second conductive-type contact layer 49 is made of a p-type GaAs material.

The second conductive-type contact layer 49 has excellent crystallinity and is formed on the comparatively flat upper surface of the current blocking layer 48', thus having excellent crystallinity and surface state compared with the conventional method. Since the amorphous and/or polycrystalline layer is removed from the current blocking layer 48 at the etching step shown in FIG. 2d, the second conductive-type contact layer 49 has improved crystallinity. Further, the formation of V-shaped grooves in the surface of the second conductive-type contact layer 49 due to the poor crystallinity of the current blocking layer 48 and the protrusions formed on the current blocking layer 48 is effectively prevented.

Although the preferred embodiment of the semiconductor laser device manufacturing method has been disclosed for illustrative purposes in FIGS. 2a to 2e, those skilled in the art will appreciate that various modifications, additions and substitutions of each step are possible, without departing from the scope and spirit of the invention. For example, FIG. 2d illustrates the wet etching step to the current blocking layer 48 under the condition in which the dielectric mask 47 is not removed. However, the wet etching step to the current blocking layer 48 may be performed after the dielectric mask 47 is removed.

The second conductive-type contact layer 49 has a comparatively flat surface without the formation of the V-shaped grooves therein. Accordingly, when an electrode is formed on the upper surface of the second conductive-type contact layer 49, a junction between the second conductive-type contact layer 49 and the electrode is stably formed. Further, the formation of cracks on the upper surface of an obtained chip during a chip-cleaving step is minimized.

Figure 3A:
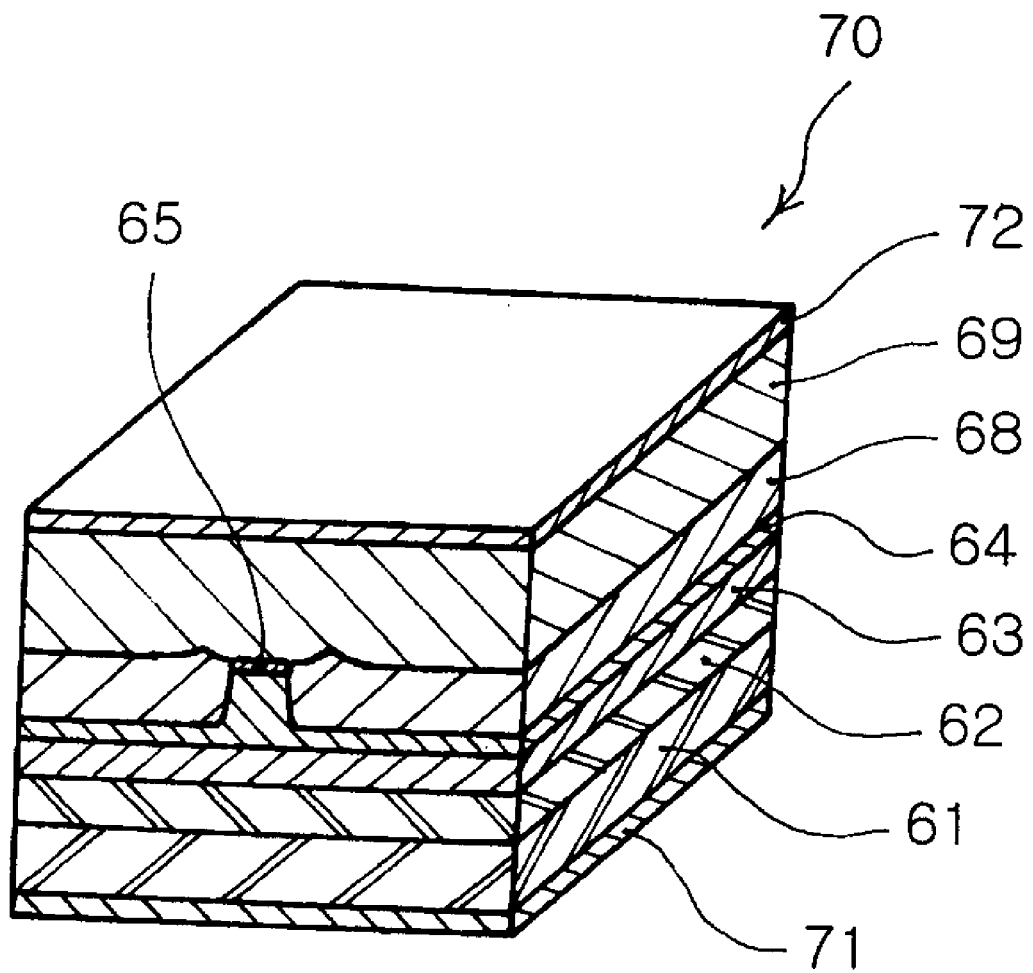
FIG. 3a is a perspective view of a semiconductor laser device manufactured by the method of the present invention.

FIG. 3a is a perspective view of a semiconductor laser device 70 manufactured by the method of the present invention.

With reference to FIG. 3a, the semiconductor laser device 70 comprises a substrate 61 provided with a first electrode 71 formed on the lower surface thereof, a first conductive-type clad layer 62 formed on the substrate 61, an active layer 63 with a multi-quantum well structure, a second conductive-type clad layer 64 with a ridge structure, and a cap layer 65 formed on the ridge structure. The semiconductor laser device 70 further comprises a current blocking layer 68 made of a first conductive-type material and formed on the upper surface of the second conductive-type clad layer 64 around the ridge structure, and a second conductive-type contact layer 69 and a second electrode 72 sequentially formed on the cap layer 63 and the current blocking layer 68.

In the semiconductor laser device 70 manufactured by the method of the present invention, the upper surfaces of the second conductive-type cap layer 65 and the current blocking layer 68 formed along the side wall of the ridge structure of the second conductive-type clad layer 64 are wet-etched, thus having a comparatively flat surface and allowing the undesired amorphous and/or polycrystalline layer to be removed.

Figure 1A:
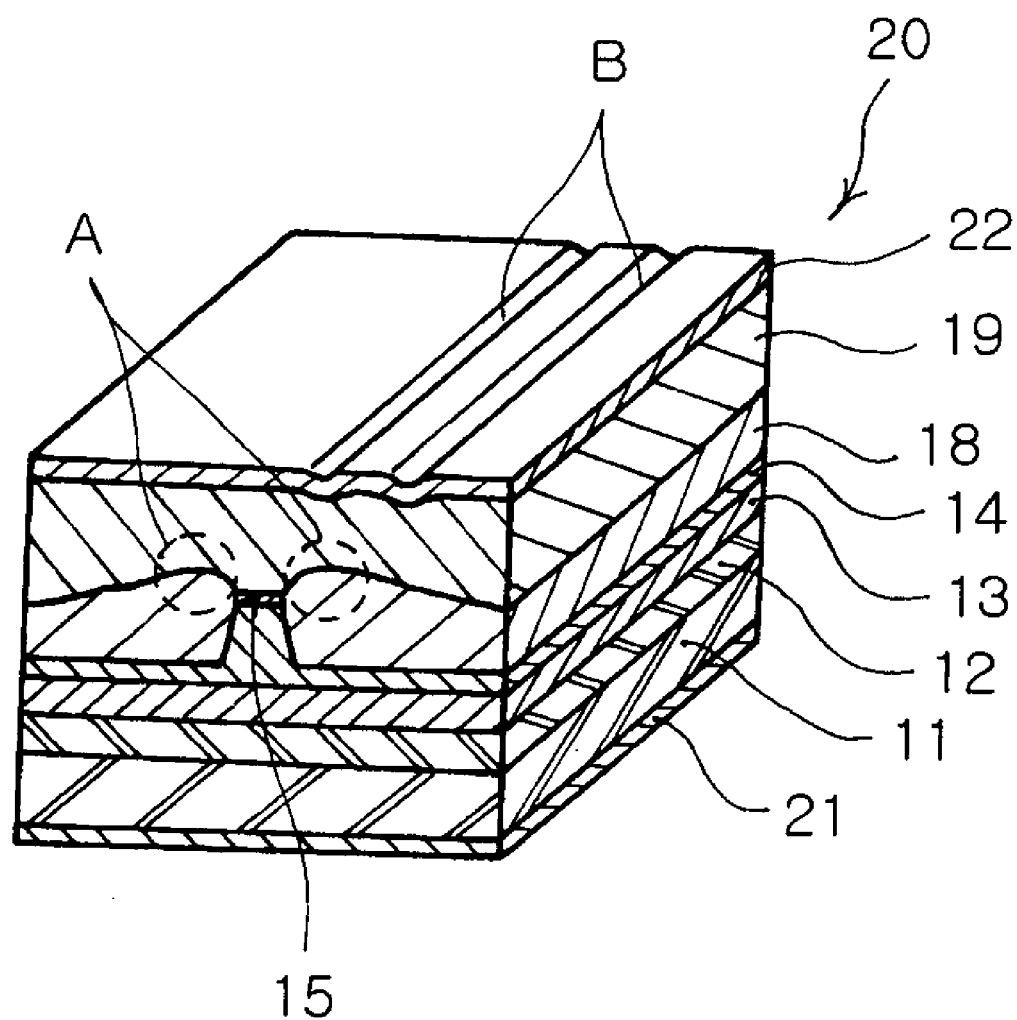
FIG. 1a is a perspective view of a conventional semiconductor laser device.

Accordingly, the second conductive-type contact layer 69 formed on the upper surface of the current blocking layer 68 has improved crystallinity and a flat surface state. That is, differing from the second conductive-type contact layer 19 of the semiconductor laser device manufactured by the conventional method shown in FIG. 1a, the second conductive-type contact layer 69 does not have any defect such as the formation of V-shaped grooves on the upper surface thereof, thus allowing an electrode formed on the second conductive-type contact layer 69 to be firmly connected to the second conductive-type contact layer 69 and preventing the electrode from being partially cut.

Figure 1B:
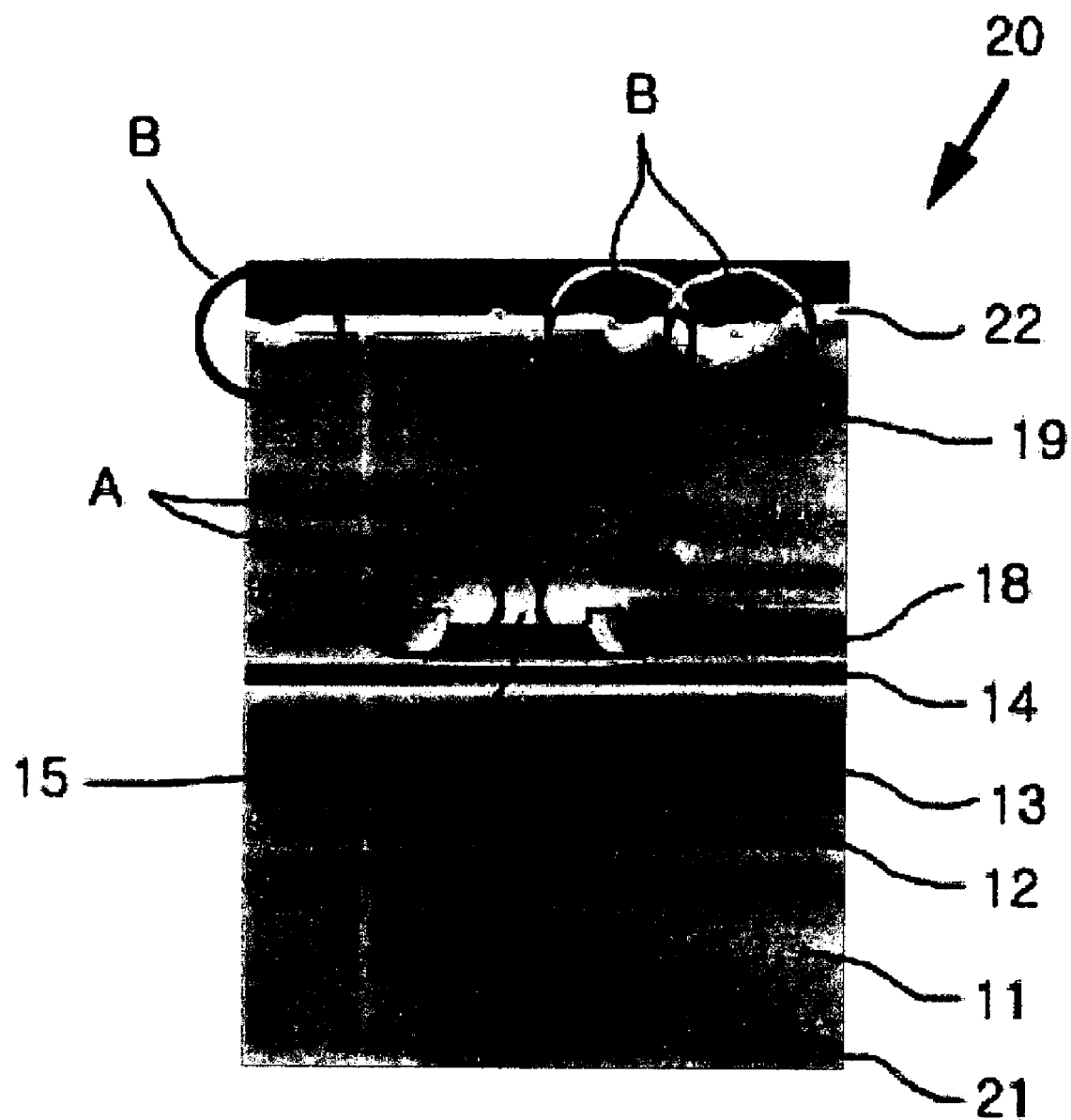
FIG. 1b is a photograph of a cross-section of the conventional semiconductor laser device.
Figure 3B:
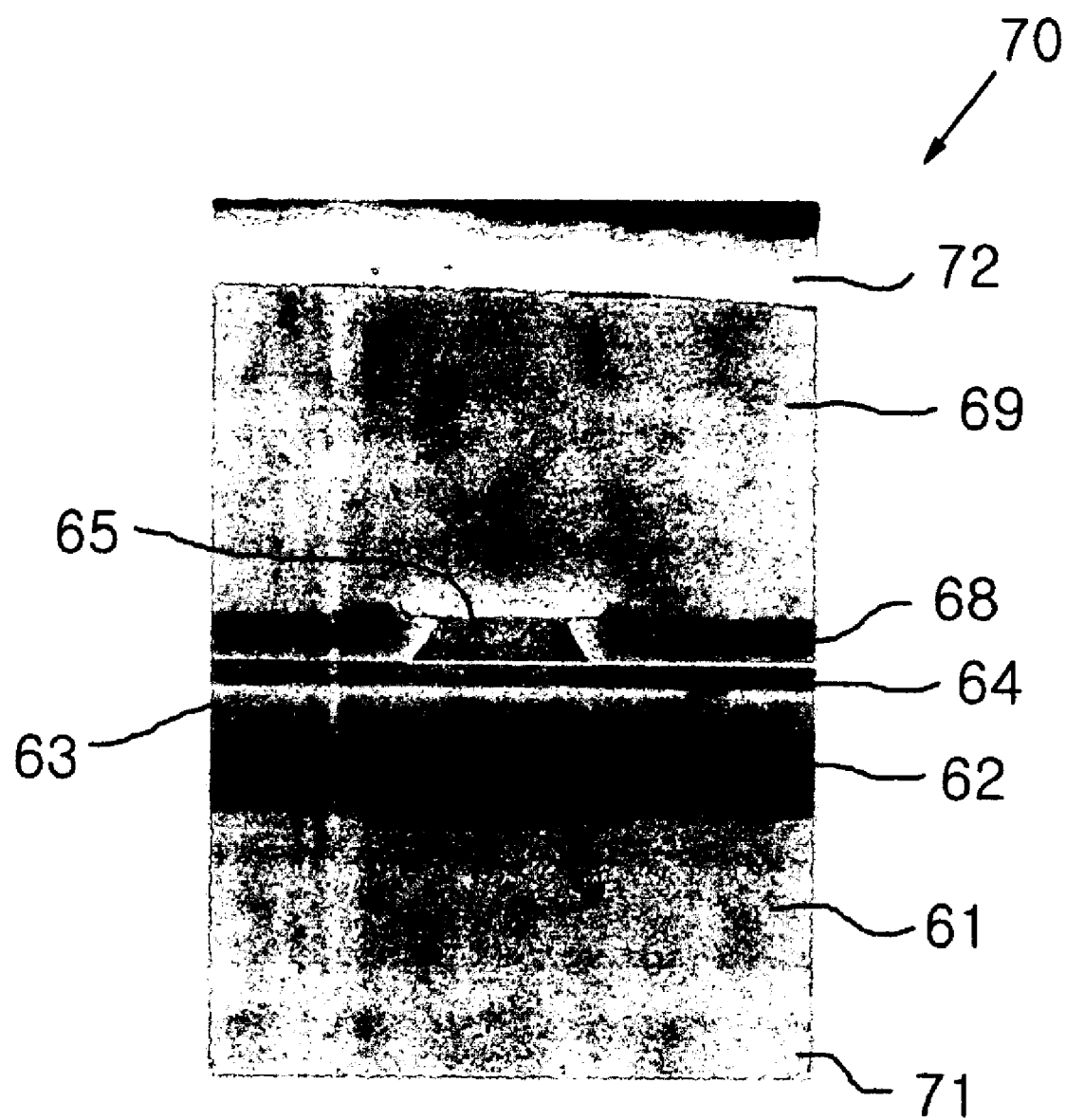
FIG. 3b is a photograph of a cross-section of the semiconductor laser device manufactured by the method of the present invention.

FIG. 3b is a photograph of a cross-section of the semiconductor laser device 70, which was substantially manufactured by the method of the present invention. As shown in FIG. 3b, the semiconductor laser device 70 of the present invention has a comparatively flat electrode formation surface due to wet-etching of the current blocking layer 68 after the second growth step for forming the current blocking layer 68. Although reduced protrusions still remain around the ridge structure, compared to the semiconductor laser device shown in FIG. 1b, the size of the reduced protrusions is considerably decreased and the entire upper surface of the current blocking layer 68 except for the reduced protrusions is flattened.

When the protrusions are decreased to have the reduced size prior to the etching step to the current blocking layer 68, the amorphous and/or polycrystalline layer is removed from the surface of the protrusions. Thereby, the second conductive-type contact layer 69 has excellent crystallinity, and an electrode formed thereon has an excellent surface state.

As apparent from the above description, the present invention provides a method for manufacturing a semiconductor laser device, comprising a step of wet-etching the uneven upper surface of a current blocking layer with a ridge structure, thereby preventing the occurrence of failures in an Ohmic electrode forming step and a chip cleaving step due to protrusions formed on the upper surface of the current blocking layer and an amorphous and/or polycrystalline layer formed on a part of the protrusions.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductor laser device, comprising the steps of:
    (a) sequentially forming a first conductive-type clad layer, an active layer, and a second conductive-type clad layer, on a first conductive-type semiconductor substrate;
    (b) forming a ridge structure by selectively etching the second conductive-type clad layer;
    (c) forming a current blocking layer around the ridge structure, said current blocking layer having protrusions on the upper surface thereof adjacent to the ridge structure, and having at least one of an amorphous and polycrystalline layer on a partial area thereof;
    (d) wet-etching the upper surface of the current blocking layer, so that at least one of the amorphous and polycrystalline layer is removed from the current blocking layer and the protrusions are reduced in size; and
    (e) forming a second conductive-type contact layer on the upper surface of the current blocking layer.

2. A method for manufacturing a semiconductor laser device, comprising the steps of:
    (a) sequentially forming a first conductive-type clad layer, an active layer, and a second conductive-type clad layer, on a first conductive-type semiconductor substrate;
    (b) forming a ridge structure by selectively etching the second conductive-tyve clad layer;
    (c) forming a current blocking layer around the ridge structure, said current blocking layer having protrusions on the upper surface thereof adjacent to the ridge structure, and having at least one of an amorphous and polycrystalline layer on a partial area thereof;
    (d) wet-etching the upper surface of the current blocking layer, so that at least one of the amorphous and polycrystalline layers is removed from the current blocking layer and the protrusions are reduced in size; and
    (e) forming a second conductive-type contact layer on the upper surface of the current blocking layer;
wherein an upper surface of the current blocking layer is a $\{100\}$ plane, and an inclined surface of the current blocking layer is near to a $\{111\}$ plane.

3. The method as set forth in claim 2;
wherein the step (b) includes:
    (b-1) forming a mask at a partial area of an upper surface of the second conductive-type clad layer; and
    (b-2) etching the second conductive-type clad layer so that the ridge structure is formed at the area of the mask.

4. The method as set forth in claim 3,
wherein the step (d) includes the step of wet-etching the upper surface of the current blocking layer after the mask is removed.

5. The method as set forth in claim 2,
wherein the current blocking layer is made of a first conductive-type AlGaAs/GaAs material.

6. The method as set forth in claim 5,
wherein the step (d) includes the step of wet-etching the upper surface of the current blocking layer using an etchant operable to oxidize and then etch the AlGaAs/GaAs material.

* * * * *